United States Patent
Feiweier

(10) Patent No.: US 10,725,134 B2
(45) Date of Patent: Jul. 28, 2020

(54) METHOD AND MAGNETIC RESONANCE APPARATUS FOR OPTIMIZING THE SIMULTANEOUS ACQUISITION OF MAGNETIC RESONANCE DATA FROM MULTIPLE SLABS OR SLICES

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 119 days.

(21) Appl. No.: 15/951,370

(22) Filed: Apr. 12, 2018

(65) Prior Publication Data

US 2018/0299524 A1 Oct. 18, 2018

(30) Foreign Application Priority Data

Apr. 12, 2017 (EP) .................................... 17166231

(51) Int. Cl.
*G01R 33/483* (2006.01)
*G01R 33/24* (2006.01)
*G01R 33/56* (2006.01)
*G01R 33/561* (2006.01)

(52) U.S. Cl.
CPC ......... *G01R 33/4835* (2013.01); *G01R 33/24* (2013.01); *G01R 33/5608* (2013.01); *G01R 33/5611* (2013.01)

(58) Field of Classification Search
CPC ............ G01R 33/4835; G01R 33/5611; G01R 33/5608; G01R 33/24
See application file for complete search history.

(56) References Cited

U.S. PATENT DOCUMENTS

| | | |
|---|---|---|
| 2013/0285656 A1 | 10/2013 | Feiweier |
| 2016/0091584 A1 | 3/2016 | Feiweier |
| 2017/0089996 A1 | 3/2017 | Feiweier |
| 2018/0040145 A1* | 2/2018 | Matthews ............ A61B 6/5264 |
| 2018/0271398 A1* | 9/2018 | Paul .................... G01R 33/4835 |
| 2018/0275237 A1* | 9/2018 | Feinberg .......... G01R 33/56325 |

OTHER PUBLICATIONS

Kenkel, et. al, "Whole-Body Diffusion Imaging Applying Simultaneous Multi-Slice Excitation"; Technical Innovations; vol. 188, No. 04; pp. 381-388; (2016).

(Continued)

*Primary Examiner* — Susan S Lee
(74) *Attorney, Agent, or Firm* — Schiff Hardin LLP

(57) ABSTRACT

In an acquisition of magnetic resonance (MR) data from a volume portion of an object, a set of a number of planned volume elements is predefined in the volume portion, wherein MR data are to be acquired from each of the planned volume elements. Furthermore, conditions that are to be fulfilled in the acquisition of the MR data of the planned volume elements are predefined. Dependent upon the planned volume elements and the conditions, a set of additional volume elements is determined. The MR data are acquired from at least two volume elements simultaneously, the at least two volume elements including one volume element from the set of the planned volume elements and one volume element from the set of the additional volume elements.

15 Claims, 3 Drawing Sheets

(56) References Cited

OTHER PUBLICATIONS

Larkman, et al.: "Use of Multicoil Arrays for Separation of Signal from Multiple Slices Simultaneously Excited"; Journal of Magnetic Resonance Imaging; vol. 13; pp. 313-317; (2001).
Feinberg, et al.: "Simultaneous Echo Refocusing in EPI"; in: Magnetic Resonance in Medicine; vol. 48, pp. 1-5; (2002).
Souza,. et al.: "SIMA: Simultaneous Multislice Acquisition of MR Images by Hadamard-Encoded Excitation"; Journal of Computer Assisted Tomography; vol. 12, No. 6; pp. 1026-1030; (1988).
Wang, et. al.: "Phase-Cycled Simultaneous Multislice Balanced SSFP Imaging with CAIPIRINHA for Efficient Banding Reduction"; Magnetic Resonance in Medicine; vol. 76, No. 6; pp. 1764-1774; (2016).
Wu, E. L. et al.: "Wideband MRI: A New Dimension of MR Image Acceleration"; in: Proc. Proc. Intl. Soc. Mag. Reson. Med.; vol. 17; p. 2678; 2009.
Xu Junqian et al:, "Evaluation of slice accelerations using multiband echo planar imaging at 3T", Neuroimage, vol. 83, pp. 991-1001, XP028758328, ISSN: 1053-8119, DOI: 10.1016/J.Neuroimage.2013. 07.055; 2013.

\* cited by examiner

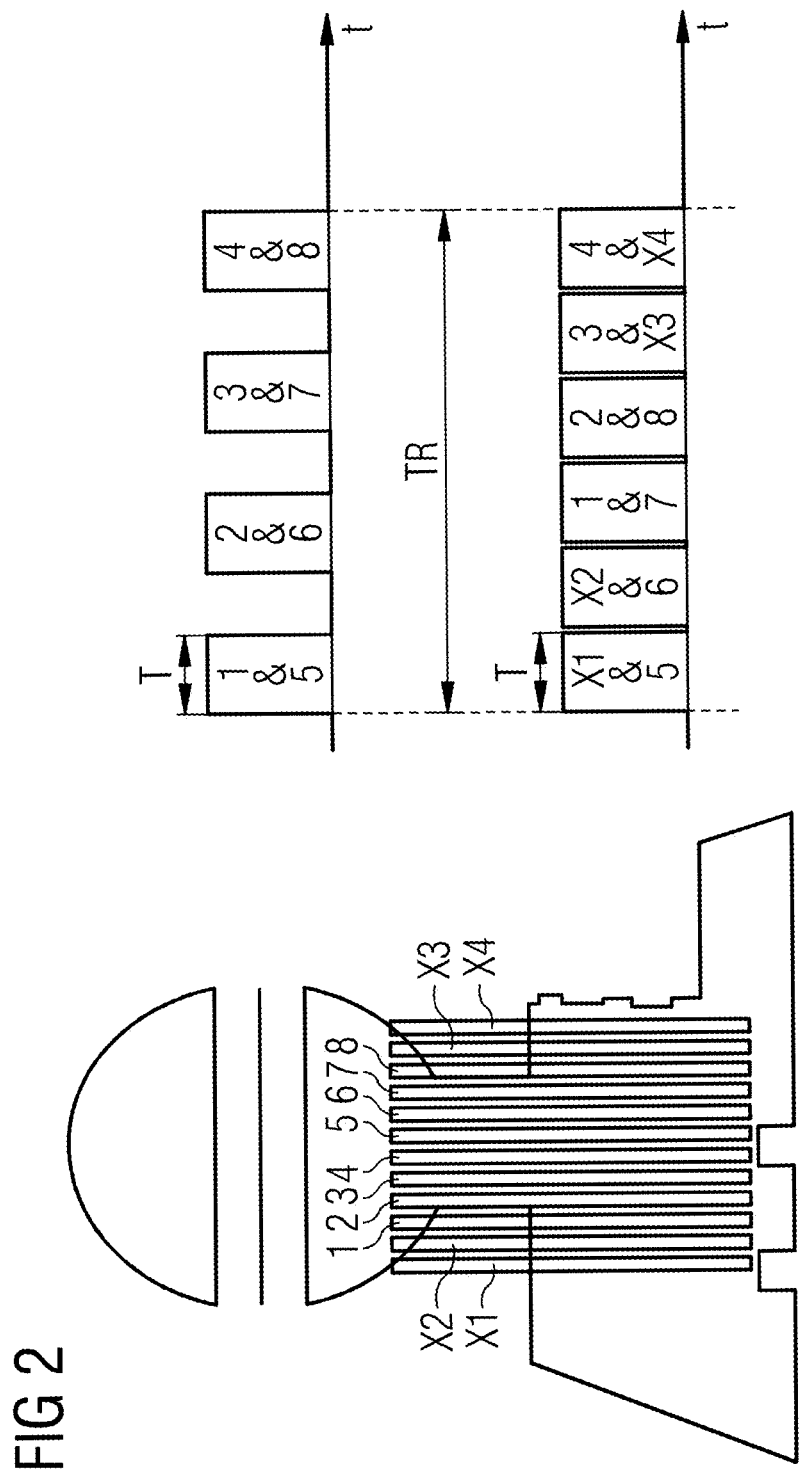

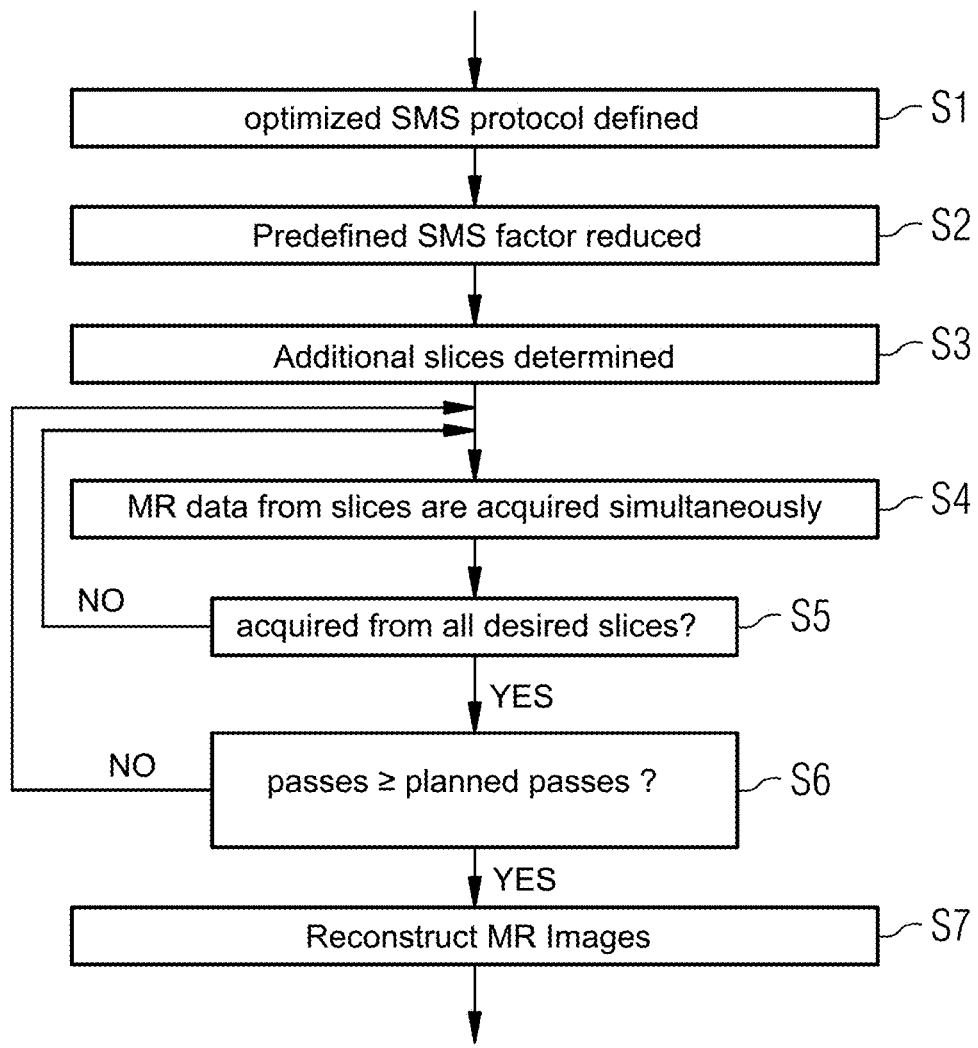

METHOD AND MAGNETIC RESONANCE APPARATUS FOR OPTIMIZING THE SIMULTANEOUS ACQUISITION OF MAGNETIC RESONANCE DATA FROM MULTIPLE SLABS OR SLICES

BACKGROUND OF THE INVENTION

Field of the Invention

The present invention concerns optimization with regard to the simultaneous acquisition of MR data from a number of volume elements (slabs or slices) of a subject.

Description of the Prior Art

The desire for ever faster MR recordings (data acquisitions) in the clinical environment is leading to renewed development of methods in which a number of images (more exactly, MR data in a number of slabs or slices) are recorded simultaneously. In general, these methods can be characterized by, at least during a part of the scan (the step of MR data acquisition), the transverse magnetization of at least two slabs or slices is used simultaneously for the imaging process. These methods are also known as multislice imaging or slice multiplexing and are often also designated simultaneous multislice (SMS) imaging.

In contrast to multislice imaging or slice multiplexing, in the conventional imaging of multiple slices, the signal (the MR data) is recorded from a number of slabs or slices alternatingly (not simultaneously), i.e. completely independently of one another with correspondingly longer scan times.

In general, simultaneous multislice imaging is used a) to record a predetermined number of slices or slabs in a relatively short time (i.e. with a relatively short repetition time TR) or b) to record a relatively large number of slices or slabs in a comparable time (i.e. with a similar repetition time TR).

If simultaneous multislice imaging is used for the reduction of recording times (option a), it should be noted that a shortening of the repetition time TR can have undesired influences on the image contrast. For example, neither for T2-weighted imaging nor for imaging weighted according to proton density can the repetition time TR be selected too short, since otherwise tissue with long T1 relaxation times is not adequately represented. Typically, therefore, the repetition time TR will not be selected to be much shorter than the maximum longitudinal relaxation time T1 relevant for the image.

On the basis of these boundary conditions, the potential advantages of the known simultaneous multislice imaging, for example with echoplanar diffusion imaging or functional imaging with EPI (Echo Planar Imaging), for example, or the use of Turbo-Spin-Echo sequences, are significantly reduced.

SUMMARY OF THE INVENTION

An object of the present invention is to provide a procedure for simultaneous multislice imaging in which, with the last mentioned application cases, the noise level is improved without thereby worsening the contrast.

In the context of the present invention, a method is provided for acquiring MR data of a volume portion of an examination object by execution of a magnetic resonance system. The inventive method has the following steps.

A set of a number of planned volume elements is defined in a computer, within the volume portion. MR data are to be acquired from each of the planned volume elements. Each of the planned volume elements can be a three-dimensional volume element (a so-called slab) or a two-dimensional volume element (a slice). In the acquisition of the MR data for a slice, the scan points differ only in two dimensions, i.e. there is only one sampling point along the slice thickness direction. By contrast, during acquisition of the MR data for a slab, the sampling points are acquired in all three spatial directions or dimensions, so that a number of sampling points exist along the thickness direction of the volume element or slab. In other words, the acquisition of the MR data for a slab takes place with a phase encoding also in the thickness direction of the slab.

Conditions are defined in the computer that are to be fulfilled with acquisition of the MR data of the planned volume elements. These conditions are the number of planned volume elements, the repetition time, the scan time of the volume element and/or the SMS factor (i.e. the number of volume elements to be acquired simultaneously), as will be described in detail below.

A set of additional volume elements (i.e. additional slabs or additional slices) is defined in the computer dependent upon the planned volume elements and the conditions. In this step, one additional slab or one additional slice, but usually a number of additional slabs or additional slices, is/are determined.

The MR data are acquired from at least two volume elements simultaneously and these at least two volume elements include a planned volume element (i.e. a volume element from the set of planned volume elements) and at least one other volume element that is an additional volume element (i.e. a volume element from the set of additional volume elements). In other words, according to the invention, the MR data of at least one planned volume element are acquired simultaneously with the MR data of at least an additional volume element. In this step, however, the MR data of a plurality of planned volume elements can also be acquired simultaneously, without the MR data of an additional volume element also being acquired at the same time. In this step, MR data are acquired from all the planned volume elements.

It should again be noted that the present invention has two variants. In the first variant, the planned volume elements are planned slabs and the additional volume elements are additional slabs, i.e., both the planned volume elements and also the additional volume elements are three-dimensional volume elements. In the second variant, both the planned volume elements and the additional volume elements are each slices or two-dimensional volume elements (i.e. planned slices and additional slices).

As will be described in detail below, in typical simultaneous multislice imaging according to the prior art, it is often the case that, following processing of all the planned volume elements, there must be a wait in order to observe the repetition time TR. According to the invention, in such a situation, the number of volume elements for which MR data are acquired is increased by the addition of the additional volume element. By this procedure, the spacing of the volume elements to be acquired simultaneously can advantageously be increased, so that the signal separation (between the simultaneously acquired volume elements) can be improved and thus the noise can be reduced. This means that, in clinical scan protocols, for example, the number of the averagings, or oversampling in one of the phase encoding directions, can be reduced, so that the overall scan time can again be reduced, while the original signal-to-noise ratio is retained.

The simultaneous acquisition of the MR data from a number of slices can be carried out, according to the invention, with one of the following methods.

Hadamard encoding (e.g. Souza et al., J. CAT 12:1026 (1988)): Two (or more) slices are excited simultaneously and by suitable configuration of the RF excitation pulses, a defined signal phase is impressed onto each slice. The signal of the magnetization from both slices is simultaneously received. A similar second excitation of both slices is carried out, although with a changed relative signal phase in the slices. The remaining imaging process (phase encoding steps) takes place as usual and the method is combinable with any desired recording techniques ((multi-) gradient echo), (multi-) spin echo etc. By means of suitable calculation operations, the signal information of both slices can be separated from the two recordings.

Simultaneous echo refocusing (SER, SIR, e.g. Feinberg et al., MRM 48:1 (2002)): Two (or more) slices are excited in quick succession and each slice is impressed with a defined spatial dephasing by means of suitable gradient pulses. The signal of the magnetization from both slices is received at a close temporal spacing by means of suitable gradient circuits. The remaining imaging process (phase encoding steps) takes place as usual and the method is combinable with any desired recording techniques ((multi-) gradient echo), (multi-) spin echo etc.). From the separately recorded data, images of both slices can be generated as usual.

Broadband data acquisition (e.g. Wu et al., Proc. ISMRM 2009: 2768): Two (or more) slices are excited simultaneously. The signal of the magnetization from both slices is simultaneously received. During the data capture, a gradient which leads to a separation of the signals of both slices in the frequency space is switched in along the slice normal. The remaining imaging process (phase encoding steps) takes place as usual and the method is combinable with any desired recording techniques ((multi-) gradient echo), (multi-) spin echo etc.). By means of suitable filtration, the signals of both the slices can be separated from the simultaneously recorded data.

Parallel imaging in the slice direction (e.g. Larkman et al. JMRI 13:313 (2001)): Two (or more) slices are excited simultaneously. The signal of the magnetization from both slices is simultaneously received with at least two (or more) coil elements. The remaining imaging process (phase encoding steps) takes place as usual and the method is combinable with any desired recording techniques (multi-gradient echo, multi-spin echo etc.). An additional calibration scan for determining the spatial receiving characteristic of the coil elements is carried out. By means of calculation operations (e.g. GRAPPA algorithm), the signals of both the slices can be separated from the simultaneously recorded data.

According to the invention, it is possible to process only the planned volume elements completely and thus to reconstruct MR images only for the planned volume elements and not to process the additional volume elements completely, so that no MR images are reconstructed for the additional volume elements. In this embodiment, it is even conceivable not to store the MR data acquired for the additional volume elements, but to discard them.

However, it is also possible to process both the planned volume elements as well as the additional volume elements completely, so that MR images are reconstructed both for the planned volume elements and also for the additional volume elements. For this purpose, it is possible, for example, to offer the user an option whether the additional volume elements are to be processed or not (thus, whether MR images should also be reconstructed for the additional volume elements or not).

According to the invention, therefore, a common processing of all the volume elements (i.e. the planned volume elements and the additional volume elements) takes place as far as the step of signal separation of the simultaneously excited volume elements. From this step onward, the MR data of the simultaneously excited volume elements is present in a separated form, so that from this step the MR data of the additional volume elements is discarded and only the MR data of the volume elements planned by the user can be further processed. By this technique, only the completely processed and stored MR images for the planned volume elements are displayed to the radiologist for diagnosis.

As previously described, the defined conditions can be the number of planned volume elements, the repetition time TR, the scan time per volume element and/or the SMS factor. The scan time for a particular volume element herein defines the time span in which MR data are acquired continuously (without interruption) for the particular volume element. The scan time also includes the preparations required for the actual recording of the MR data, such as the excitation, spoiling, phase encoding, rephasing, etc. In other words, the scan time defines the time span for the execution of a recording module of a volume element. If the cumulative scan time for the particular volume element defines the time span during which all the MR data is acquired for the particular volume element, the cumulative scan time can be calculated from the product of the scan time and the number of passes during which MR data are continuously or progressively acquired for the particular volume element. The total scan time for all the volume elements is then significantly greater again than the cumulative scan time, since the waiting times during which no MR data for the respective volume element can be acquired must still be taken into account. The total scan time generally corresponds to the product of the number of passes and the repetition time TR.

According to a preferred inventive embodiment, before recording the MR data, a check is made as to whether the SMS factor can be reduced, dependent upon the number of planned volume elements $\#_{pS}$. For this purpose, it is checked whether the following inequality (1) applies:

$$TR \geq \frac{\#_{pS}}{(SMS-1)} \cdot T, \qquad (1)$$

If the inequality (1) applies, the SMS factor SMS is decremented and it is then checked whether the inequality (1) still applies for the decremented SMS factor SMS. If this is still the case, the SMS factor SMS is again decremented, which is continued until either the inequality (1) no longer applies or until the SMS factor has the value 1. According to the invention, the acquisition of the MR data is then carried out with the original SMS factor SMS if the inequality (1) already did not apply for this original SMS factor or the acquisition of the MR data is carried out with the correspondingly often decremented SMS factor SMS. In other words, the number of additional volume elements is determined dependent upon the final SMS factor with which the acquisition of the MR data is also carried out, as described above.

The SMS factor defined by the user in the scan protocol thus effectively provides an allowed upper limit which can be optimized (i.e. reduced) according to the invention.

The MR data are acquired for one or more additional volume elements only if the following inequality (2) applies:

$$\frac{N}{SMS} \cdot T \leq TR - T \qquad (2)$$

Herein, N corresponds to the number of planned volume elements, SMS corresponds to the SMS factor, T the scan time and TR the predetermined repetition time.

Only when the above inequality (2) is fulfilled is sufficient time available in order, in addition to the MR data for the planned volume elements, to record MR data for at least one additional volume element.

In addition, the following applies: If the predetermined repetition time TR is so long that each volume element can be scanned individually (i.e. not simultaneously with another volume element), then it is unnecessary to acquire MR data for one or even a plurality of additional volume elements.

The number of additional volume elements can be calculated starting from the number of all volume elements for which MR data is acquired in that from this number of all the volume elements, the number of planned volume elements is subtracted. The number of all the volume elements $\#_S$ can be determined on the basis of the following equation (3):

$$\#_S = SMS \cdot \text{floor}\left(\frac{TR}{T}\right). \qquad (3)$$

Herein, SMS corresponds to the SMS factor which defines for how many volume elements simultaneously MR data is acquired. Furthermore, TR corresponds to the repetition time and T the scan time per volume element.

The rounding function floor(x), which is also known as the floor function, assigns to the function argument x the nearest natural number that it not larger than the function argument x. Thus if the function argument x corresponds to a natural number, the function value corresponds to the function argument x.

In a normal case, MR data are acquired for all the additional volume elements. However, it is possible according to the invention that due, for example, to physiological limitations (e.g. on the basis of the SAR ("Specific Absorption Rate") or of stimulations), a predetermined limit for the number of additional volume elements is to be taken into account. If, for example, the number of additional volume elements calculated with the aid of equation (3) is greater than this predetermined limit, the number of additional volume elements is reduced until this predetermined limit is adhered to. In other words, the number of all the volume elements is reduced by the value SMS until either the predetermined limit is adhered to or until (in the extreme case) the number of all the volume elements $\#_S=0$ applies.

This advantageously ensures that the present invention complies with the predetermined physiological limitations.

According to an embodiment of the invention, the step of acquiring the MR data comprises an adjustment optimization. Herein, the adjustment optimization is configured within a wider range on the basis of the spatial position of the respectively planned volume element than on the basis of the spatial position of the respective additional volume element.

Since, under some circumstances, the MR data of the additional volume elements are even discarded, it is more useful to orient the adjustment optimization during an acquisition of MR data in which MR data of a planned volume element and of an additional volume element are acquired simultaneously, to the position of the planned volume element.

The adjustment optimization can include at least one process from the following group of processes.

Optimization of the center frequency: Given knowledge of the spatial B0 field distribution, for each of the simultaneously recorded volume elements, an optimum mean precession frequency can be determined. For example, a weighted mean value of the frequencies can be assigned to the corresponding recording module. Herein, the weighting of the mean frequencies assigned to the additional volume elements can be selected to be smaller in order thus, for example, to counter limitations in the transmitting bandwidth.

Optimization of shim currents: Given knowledge of the spatial B0 field distribution, for each of the simultaneously recorded volume elements, an optimum setting of shim currents for field homogenization can be determined. For example, a weighted mean value can be assigned to the corresponding recording module. Herein, the weighting of the shim currents assigned to the additional volume elements can be selected to be smaller in order thus to achieve a better field homogeneity in the planned volume elements than in the additional volume elements.

Optimization of a transmitter scaling: Given knowledge of the spatial B1 field distribution, for each of the simultaneously recorded volume elements, an optimum mean transmitter scaling can be determined. For example, a weighted mean value can be assigned to the corresponding recording module. Herein, the weighting of the transmitter scalings assigned to the additional volume elements can be selected to be smaller in order thus to achieve a better field flip angle constancy in the planned volume elements than in the additional volume elements. If simultaneous excitation pulses with individual transmitter scaling of each sub-pulse are used, reduced scaling (in the extreme case to zero) can be assigned to the additional slices, which leads directly to a smaller SAR. (With the scaling at zero, in principle, a mixed operation is achieved with different SMS factors).

Optimization of a multichannel transmitter: Given knowledge of the spatial B1 field distribution, for each of the simultaneously recorded volume elements, an optimum setting of the current distribution (amplitude and phase) in the individual transmitting channels can be determined. For example, a weighted mean value can be assigned to the corresponding recording module.

Optimization of an eddy current compensation: Herein, the eddy current compensation is carried out so that the eddy currents are compensated within the respectively planned volume element better than the eddy currents within the respective additional volume element.

Optimization of a compensation of transverse components of the gradient field ("Maxwell field terms"): Herein, the Maxwell compensation is carried out so that the effects of transverse components of the gradient fields are compensated within the respectively planned volume element better than those of transverse components within the respective additional volume element.

Optimization of a non-linearity correction of the gradient fields: Herein, the non-linearity correction is carried out so that the non-linearities are compensated within the respectively planned volume element better than within the respective additional volume element.

In principle, the spacing between adjacent planned volume elements is constant. This spacing also corresponds, in particular, to the spacing between two adjacent additional volume elements and also to the spacing between an additional volume element and a planned volume element adjoining this additional volume element.

In principle, the spacing between two adjacent additional volume elements and the spacing between an additional volume element and a planned volume element adjoining this additional volume element can also be greater than the spacing between two adjacent planned volume elements. The advantage would be an improved separation between the volume elements, i.e. less g-factor noise. However, the additional volume elements would be less well evaluable to the radiologist so that the MR data of the additional volume elements would probably be discarded. Furthermore, effects on the image contrast could arise on the basis of crosstalk or magnetization-transfer effects.

In other words, the spacing between two adjacent volume elements of the volume element stack composed of the planned volume elements and the additional volume elements is identical or constant. This applies regardless of whether the spacing lies between two adjacent planned volume elements, between two adjacent additional volume elements or between a planned volume element and an adjacent additional volume element.

If the planned volume elements are imagined to be a volume element stack, the additional volume elements are advantageously arranged in the most equal possible proportions above and below this volume element stack.

If therefore, for example, n additional volume elements exist, then n/2 additional volume elements are arranged before the volume element stack of planned volume elements and n/2 additional volume elements are arranged after this volume element stack. As a rule, the number of additional volume elements is even. If the number of the additional volume elements were to be odd, the number of additional volume elements arranged before this volume element stack differs from the number of additional volume elements arranged after this volume element stack by one additional volume element.

According to a preferred inventive embodiment, the set of the planned volume elements and the set of the additional volume elements form a total set of volume elements. During acquisition of the MR data, a pass is performed at least once and, typically, a plurality of times. In each of these passes, MR data is acquired for each volume element of the total set. Herein, MR data are acquired simultaneously from at least two volume elements of the total set. The spacing between adjacent volume elements from which MR data is acquired simultaneously is constant.

In other words, according to this embodiment, the acquisition of the MR data typically takes place in a plurality of passes. In each of these passes, MR data are acquired from each volume element. Each pass is subdivided into portions, wherein in each portion, MR data are acquired simultaneously for a plurality of volume elements. The spacing between adjacent volume elements from which MR data are acquired simultaneously is herein constant for all portions.

The present invention also encompasses a magnetic resonance apparatus having an MR data acquisition scanner with a radio-frequency (RF) antenna arrangement and a gradient coil arrangement. The apparatus also has a control computer with an RF controller and a gradient controller that respectively operate the RF antenna arrangement and the gradient coil arrangement. The control computer is configured to operate the MR data acquisition scanner so as to acquire MR data of a volume portion of an examination object. The control computer is configured to operate the scanner so as to acquire MR data from each volume element of a predetermined set of planned volume elements in the volume portion, in order to determine a quantity of additional volume elements within the volume portion, dependent upon the planned volume elements and on conditions, and so as to acquire MR data from at least two volume elements simultaneously. One volume element originates from the set of the planned volume elements and one volume element from the set of the additional volume elements, so that MR data of a planned volume element and MR data of an additional volume element are acquired simultaneously.

The advantages of the inventive magnetic resonance system essentially correspond to the advantages of the inventive method, described above. The present invention also encompasses a non-transitory, computer-readable data storage medium encoded with programming instructions that, when the storage is medium is loaded into a computer or computer system of a magnetic resonance apparatus, cause the computer or computer system to operate the magnetic resonance apparatus in order to execute any or all embodiments of the method according to the invention, as described above.

The program code can be a source code (e.g. C++) which must still be compiled (translated) and bound or which must only be interpreted, or is an executable software code which, for execution, need only be loaded into the corresponding computer unit or control device.

The electronically readable data carrier can be, for example, a DVD, a magnetic tape, a hard disk drive or a USB stick, on which the electronically readable control code is stored.

The underlying principle of the present invention is to record as many simultaneous volume elements as possible with a predetermined scan protocol, but only to store and process as few as necessary (in particular only the planned volume elements). In other words, for a predetermined scan protocol of a simultaneous multi-volume element recording, a larger number of volume elements is acquired than planned, but without changing the recording parameters, and only the planned volume elements are completely processed.

The present invention is based on the insight that, by an increase in the number of the volume elements to be acquired, the spatial separation of the simultaneously excited volume elements is also increased. Since the signal separation of the simultaneously excited volume elements is dependent on the spatial sensitivity profiles of the receiving coils, the signal separation is easier the larger the spacing is between the simultaneously excited volume elements.

With more favorable system configurations having a lower density of receiving coil elements, the spacing of the simultaneously excited volume elements, enlarged by the additional volume elements, advantageously improves the image quality.

BRIEF DESCRIPTION OF THE DRAWINGS

FIG. 2 schematically shows how, according to the invention, MR data are acquired from a number of slices simultaneously.

FIG. 3 is a flowchart of the inventive method for acquiring MR data.

DESCRIPTION OF THE PREFERRED EMBODIMENTS

Figure 1:
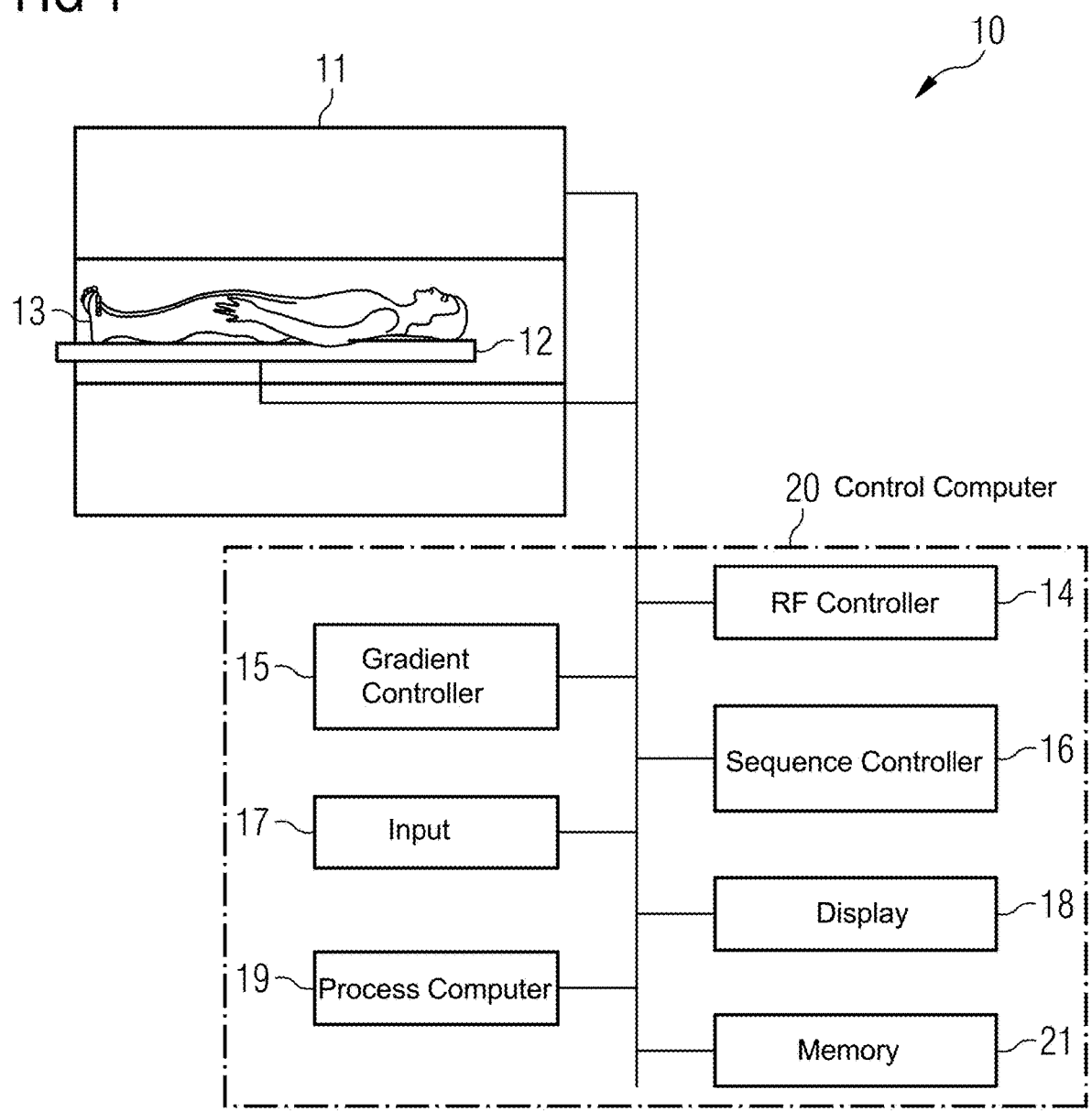
FIG. 1 schematically illustrates a magnetic resonance system with which MR data are acquired according to the invention.

With regard to FIG. 1, a magnetic resonance apparatus 10 is shown with which, as described below, MR data are acquired from a number of volume elements or slices simultaneously. The magnetic resonance apparatus 10 has a scanner 11 with a basic field magnet that generates a polarization field B0 wherein a patient 13, on a support 12, is moved into the scanner 11 in order to record spatially-encoded magnetic resonance signals (raw MR data) from the patient 13. The coils used for signal detection, such as a whole body coil or local coils are not shown for clarity. By radiation of radio-frequency (RF) pulses and the switching of magnetic field gradients, the magnetization of nuclear spins created by the polarization field B0 is deflected out of the equilibrium position and spatially encoded, and the resultant magnetization is detected by the receiving coils. The creation of MR images by the radiation of RF pulses and the switching of magnetic field gradients in different combinations and sequences is in principle known to those skilled in the art, and thus need not be described in further detail herein.

The magnetic resonance apparatus 10 also has a control computer 20 that controls the magnetic resonance scanner 11. The control computer 20 has a gradient controller 15 for the control and switching of the necessary magnetic field gradients. An RF controller 14 is provided for the control and generation of the RF pulses for deflecting the magnetization. An image sequence controller 16 controls the sequence of the magnetic field gradients and RF pulses and thus indirectly the gradient controller 15 and the RF controller 14. Via an input unit 17, an operator can control the magnetic resonance system 10 and on a display unit 18, MR images and other information necessary for the control can be displayed. A process computer 19 with at least one processor (not shown) is provided for controlling the different units in the control computer 20. Furthermore, a memory unit 21 is provided in which, for example, program modules or programs can be stored which, when they are executed by the process computer 19 or its processor, can control the sequence of the magnetic resonance system 10. The process computer unit 19 is also configured to calculate MR images from the acquired MR signals.

It is shown schematically in FIG. 2 how, firstly according to the prior art and, secondly, according to the invention, a simultaneous multislice imaging is carried out.

In the left part of FIG. 2, the planned slices are shown identified with the reference signs 1 to 8. The planned slices 1-8 lie in a volume portion of an examination object from which MR images are to be generated.

In a simultaneous multislice imaging process according to the prior art, in a first pass MR data is acquired from the slices 1 and 5, then from the slices 2 and 6, then from the slices 3 and 7 and finally from the slices 4 and 8, respectively simultaneously. Since the predetermined minimum repetition time TR is greater than the product of the number of planned slices 8 and the scan time T per slice divided by the SMS factor (in this case 2), there exist pauses between the individual scan times, during which simultaneously MR data for two slices is acquired. The procedure according to the prior art is shown at top right in FIG. 2. On the basis of these repeated short pauses in the scan sequence, the magnetic resonance system 10 is not used efficiently.

For example, as a result of equation (3) set out above, under the given conditions (repetition time TR, scan time T and SMS factor), according to the invention, MR data can be acquired from four additional slices simultaneously in addition to the eight planned slices, without the total scan time thereby having to be extended. These four additional slices X1-X4 are also shown to the left in FIG. 2. Herein, two of these additional slices X1, X2 lie before the slice stack of planned slices 1-8 and two of these additional slices X3, X4 lie after this slice stack.

The inventive scan sequence of the planned slices 1-8 with the additional slices X1-X4 is shown at bottom right in FIG. 2. In this inventive simultaneous multislice imaging process, during the first pass, MR data is acquired from the slices X1 and 5, then from the slices X2 and 6, then from the slices 1 and 7, then from the slices 2 and 8, then from the slices 3 and X3 and finally from the slices 4 and X4, respectively simultaneously.

If the prior art simultaneous multislice imaging is compared with the inventive simultaneous multislice imaging, it can be seen that according to the prior art, the spacing between the slices for which respectively MR data is acquired simultaneously is 4 slices according to the prior art, whereas this spacing according to the invention is 6 slices. By means of this enlarged spacing, according to the invention, the noise level can advantageously be improved without thereby worsening the contrast. The greater spacing according to the invention advantageously simplifies the signal separation between the simultaneously excited slices. In an MR image reconstructed from the MR data acquired according to the invention, this increased spacing advantageously expresses itself, firstly, by means of a lessening of slice-separation artifacts ("slice leakage") and, secondly, by a lessening of the so-called acceleration noise ("g-factor noise"). Summarizing, the image quality can advantageously be improved by the larger spacing.

The present invention will now be described on the basis of examples. Herein, different inventive embodiments are described, in particular, for a T2-weighed sagittal turbo-spin-echo imaging of the spinal column.

Example 1

Example 1 has the following requirements or conditions:

The number of planned slices is 16, which is sufficient for a complete coverage of the volume portion to be examined.

The desired contrast requires a minimum repetition time TR of 3200 ms.

The duration of a single echo train (TSE module) and thus the scan time T is 250 ms.

For a complete MR image, 20 echo trains are required.

In order to achieve a sufficiently large signal-to-noise ratio, 5 averagings are needed.

In a conventional single-layer imaging process, a real repetition time $TR_{real}$=250 ms*16=4000 would result, from which the total scan time of 5*20*4000 ms=6:40 minutes results.

In a conventional multi-slice imaging process with an SMS factor of 2, the repetition time could be TR=250 ms*16/2=2000 ms. Since, however, the minimum repetition time TR is 3200 ms, the real repetition time corresponds to this predetermined minimum repetition time. On the basis of the small slice spacing of the simultaneously excited slices, the noise (g-factor) disadvantageously increases, so that the number of averagings as compared with the conventional single slice imaging must be increased from 5 to 6. Therefore, the total scan time becomes 6*20*3200 ms=6:24 minutes.

According to the invention, for example, according to equation (3), $\#_S=2*\text{floor}(3200 \text{ ms}/250 \text{ ms})=2*12=24$ slices can be scanned overall within the repetition time TR. Thus, 8 additional slices can be scanned in addition to the planned 16 slices. Due to the larger slice separation, as compared with the conventional multislice imaging (see above), between the respective pairs of slices for which MR data is acquired simultaneously, the signal separation is improved, so that the noise is reduced, with the result that 5 averagings are sufficient. Therefore, the total scan time becomes 5*20*3200 ms=5:20 minutes.

The MR data acquired for the additional slices can herein be discarded so that for the additional slices, no MR images are reconstructed, so that the user sees and must assess only MR images for the planned slices. According to the invention, it is naturally also possible to reconstruct MR images for the additional slices, if this is required.

Example 2

Example 2 has the following requirements or conditions:
The number of planned slices is 10.
The minimum repetition time TR is 2000 ms.
The duration of a single echo train (TSE module) and thus the scan time T is 200 ms.
For a complete MR image, 20 echo trains are required.
2 is given as the SMS factor.

Since with the number of planned slices at 10, the repetition time TR of 2000 ms, the scan time T of 200 ms and the SMS factor of 2, the inequality (1) defined above is fulfilled, the SMS factor is decremented. Since the new or decremented SMS factor is 1, it need not be further checked whether the inequality (1) also applies for the new SMS factor. Rather, the 10 planned slices are acquired conventionally, i.e. with a single slice imaging process. By this means, additional noise ("g-factor noise") and deconvolution artifacts are prevented.

Example 3

Example 3 has the following requirements or conditions:
The number of planned slices is 12.
The minimum repetition time TR is 2800 ms.
The duration of a single echo train (TSE module) and thus the scan time T is 400 ms.
3 is given as the SMS factor.

Since with the number of planned slices at 12, the repetition time TR of 2800 ms, the scan time T of 400 ms and the SMS factor of 3, the inequality (1) defined above is fulfilled, the SMS factor is decremented. Since the above inequality (1) for the new SMS factor 2 no longer applies, the MR data is acquired with the SMS factor 2. Since the number of all slices according to equation (3) is 14, in addition to the 12 planned slices, 2 additional slices are acquired.

FIG. 3 shows a flowchart for the inventive method.

In step S1, the user defines for his requirements (contrast and slice coverage) an optimized SMS protocol in that the number of planned slices, the repetition time TR, the scan time T and the SMS factor are stipulated. The scan time T is herein not usually specified directly by the user, since the scan time T can be determined indirectly, for example, by means of the resolution, FOV ("field of view"), scan sequence, etc. Subsequently, in step S2, on the basis of the inequality (1) described above, it is checked whether the predefined SMS factor can be reduced. In particular with the inequality (3) described above, dependent upon the repetition time TR, the scan time T, the number of planned slices and the SMS factor possibly reduced in step S2, in step S3, additional slices are determined.

In step S4, dependent upon the SMS factor, MR data from a number of slices are acquired simultaneously. This step S4 is repeated until a pass is ended for all slices (planned slices and additional slices) (see query in step S5). Here, for example, on each pass, an echo train is processed for all the slices. If the number of passes carried out is equal to the number of planned passes (see query in step S6), the acquisition of the MR data ends in that MR images are reconstructed in step S7, typically only for the planned slices. If the number of passes completed still does not correspond to the number of planned passes, the inventive method branches back to step S4. The number of planned passes can be determined, for example, by the product of the number of averagings required and the number of the echo trains to be acquired per slice.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus, comprising:
   in a computer, defining a set comprising a plurality of planned volume elements in a volume portion of an examination subject, from which MR data are to be acquired from each of the planned volume elements;
   in said computer, defining conditions that are to be satisfied during acquisition of the MR data of the plurality of planned volume elements;
   in said computer, using said plurality of planned volume elements and said defined conditions in order to determine a set of additional volume elements; and
   from said computer, providing control signals to an MR data acquisition scanner in order to acquire MR data from at least two volume elements simultaneously, said at least two volume elements comprising one volume element from said set of planned volume elements and one volume element from said set of additional volume elements.

2. A method as claimed in claim 1 wherein each planned volume element is a planned slice and each additional volume element is an additional slice.

3. A method as claimed in claim 1 comprising:
   in said computer, reconstructing MR image data from the MR data acquired by said MR data acquisition scanner, by executing an MR image reconstruction algorithm; and
   in said MR image reconstruction algorithm, making no contribution to said image data from the MR data acquired from said additional volume element, and using the MR data acquired from said planned volume element in order to reconstruct said MR image data.

4. A method as claimed in claim 1 comprising selecting said conditions from the group consisting of a number of said planned volume elements, a repetition time of a scan, a scan time per volume element that begins when MR data from a respective volume element are acquired and ends when no more data are acquired from the respective volume element but MR data from another volume element are acquired or no more MR data at all are acquired, and a simultaneous multi-slice (SMS) factor that determines how many volume elements from which the MR data are acquired simultaneously.

5. A method as claimed in claim 4, wherein, if $$TR \geq \frac{\#_{pS}}{(SMS-1)} \cdot T, \quad (1)$$

decrementing the SMS factor until (1) no longer applies or the SMS factor is equal to one, wherein TR is a repetition time of said scan, $\#_{pS}$ is the number of planned volume elements, and T is the scan time per volume element.

6. A method as claimed in claim 4 comprising acquiring the MR data for at least one additional volume element only if $$\frac{N}{SMS} \cdot T \leq TR - T$$

wherein N is a number of planned volume elements, SMS is the SMS factor, T is a scan time per volume element and TR is the repetition time of the scan.

7. A method as claimed in claim 4 wherein a number of the additional volume elements is a difference of a number of all volume elements minus the number of planned volume elements and comprising determining a number $\#_S$ of all volume elements by $$\#_S = SMS \cdot \text{floor}\left(\frac{TR}{T}\right)$$

wherein SMS is the SMS factor, TR is the repetition time of the scan, T is the scan time per volume element and wherein $$\text{floor}\left(\frac{TR}{T}\right)$$

is a nearest natural number that is not greater than TR/T.

8. A method as claimed in claim 1 comprising limiting a number of the additional volume elements to a predetermined limit number.

9. A method as claimed in claim 1 comprising acquiring said MR data with an adjustment optimization implemented in said computer that favors a spatial position of the planned volume elements relative to a spatial position of the additional volume element.

10. A method as claimed in claim 9 comprising selecting said adjustment optimization from the group consisting of optimization of a center frequency, optimization of shim currents, optimization of transmitter scaling, optimization of a multi-channel transmitter, optimization of an eddy current compensation, optimization of a compensation of transverse components of gradient fields, and optimization of a non-linearity correction of gradient fields.

11. A method as claimed in claim 1 comprising setting a spacing between two adjacent planned volume elements equal to a spacing between two adjacent additional volume elements, and equal to a spacing that an additional volume element has from an adjacent planned volume element.

12. A method as claimed in claim 1 wherein said planned volume elements form a volume element stack and dividing the additional volume elements into two sets that are as equal as possible in size, wherein one of said two sets is situated before the volume element stack and another of said two sets is situated after the volume element stack.

13. A method as claimed in claim 1 wherein a quantity of the planned volume elements and the additional volume elements form a total set of volume elements, and performing a pass of said total set of volume elements at least one for acquiring said MR data and, during said pass, acquiring MR data for each volume element from the total set simultaneously from at least two volume elements in the total set, with a spacing between adjacent volume elements from which MR data are acquired simultaneously being constant.

14. A magnetic resonance (MR) apparatus comprising:
an MR data acquisition scanner; and
a computer configured to:
define a set comprising a plurality of planned volume elements in a volume portion of an examination subject, from which MR data are to be acquired from each of the planned volume elements;
define conditions that are to be satisfied during acquisition of the MR data of the planned volume elements;
use said plurality of planned volume elements and said defined conditions in order to determine a set of additional volume elements; and
provide control signals to said MR data acquisition scanner in order to acquire MR data from at least two volume elements simultaneously, said at least two volume elements comprising one volume element from said set of planned volume elements and one volume element from said set of additional volume elements.

15. A non-transitory, computer-readable data storage medium encoded with programming instructions, said storage medium being loaded into a computer of a magnetic resonance (MR) apparatus comprising an MR data acquisition scanner, said programming instructions causing said computer to:
define a set comprising a plurality of planned volume elements in a volume portion of an examination subject, from which MR data are to be acquired from each planned volume element of the plurality of planned volume elements;
define conditions that are to be satisfied during acquisition of the MR data of the plurality of planned volume elements;
use said plurality of planned volume elements and said defined conditions in order to determine a set of additional volume elements; and
provide control signals to said MR data acquisition scanner in order to acquire MR data from at least two volume elements simultaneously, said at least two volume elements comprising one volume element from said set of planned volume elements and one volume element from said set of additional volume elements.

* * * * *